United States Patent
Hembree (10) Patent No.: US 6,297,653 B1
(45) Date of Patent: Oct. 2, 2001

(54) INTERCONNECT AND CARRIER WITH RESISTIVITY MEASURING CONTACTS FOR TESTING SEMICONDUCTOR COMPONENTS

(75) Inventor: David R. Hembree, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/342,169

(22) Filed: Jun. 28, 1999

(51) Int. Cl.⁷ .................. G01R 31/02; G01R 27/08; G01R 31/26
(52) U.S. Cl. .................. 324/755; 324/715; 324/765; 324/754
(58) Field of Search ................... 324/755, 715, 324/538, 754, 756, 763, 765

(56) References Cited

U.S. PATENT DOCUMENTS

| | | |
|---|---|---|
| 3,609,539 | 9/1971 | Gunthert . |
| 3,806,800 * | 4/1974 | Bove ................... 324/538 |
| 4,161,692 | 7/1979 | Tarzwell . |
| 4,177,425 | 12/1979 | Lenz . |
| 4,218,650 | 8/1980 | Matzen . |
| 4,383,217 | 5/1983 | Shiell . |
| 4,456,879 | 1/1984 | Kleinknecht . |
| 4,486,705 | 12/1984 | Stopper . |
| 4,868,490 | 9/1989 | Blumenthal . |
| 4,896,108 | 1/1990 | Lynch et al. . |
| 5,286,656 | 2/1994 | Keown et al. . |
| 5,442,297 | 8/1995 | Verkuil . |
| 5,483,741 | 1/1996 | Akram et al. . |
| 5,519,332 | 5/1996 | Wood et al. . |
| 5,559,444 | 9/1996 | Farnworth et al. . |
| 5,565,767 | 10/1996 | Yoshimizu et al. . |
| 5,592,736 | 1/1997 | Akram et al. . |
| 5,634,267 | 6/1997 | Farnworth et al. . |
| 5,686,317 | 11/1997 | Akram et al. . |
| 5,712,571 | 1/1998 | O'Donoghue . |
| 5,796,264 | 8/1998 | Farnworth et al. . |
| 5,815,000 | 9/1998 | Farnworth et al. . |
| 5,834,945 | 11/1998 | Akram et al. . |
| 5,838,161 | 11/1998 | Akram et al. . |
| 5,878,485 | 3/1999 | Wood et al. . |
| 5,896,036 | 4/1999 | Wood et al. . |

(List continued on next page.)

OTHER PUBLICATIONS

U.S. application No. 09/621,121 Hembree, filed Jul. 21, 2000.

*Primary Examiner*—Safet Metjahic
*Assistant Examiner*—Anjan K Deb
(74) *Attorney, Agent, or Firm*—Stephen A. Gratton (57) ABSTRACT

A test interconnect, a test method, a test carrier, and a test system for testing semiconductor components are provided. The interconnect includes a substrate, and a pattern of interconnect contacts on the substrate for electrically engaging terminal contacts on a component under test. At least one pair of interconnect contacts comprise resistivity contacts configured for electrically engaging interconnected terminal contacts, such as Vss or Vcc contacts, on the component. The resistivity contacts include test pads arranged as a four terminal Kelvin structure. A resistivity measuring circuit can be electrically connected to the test pads for evaluating a total resistance Rx between the resistivity contacts. Using the total resistance Rx, and a standard based on prior resistance measurements, the contact resistances between the resistivity contacts, and the interconnected terminal contacts on the component can be quantified. The test method includes the step of measuring and evaluating the total resistance Rx, and then adjusting the test signals as required. The test carrier includes a base wherein the interconnect is mounted, and a force applying mechanism for biasing the component against the interconnect. The test system includes multiple interconnects mounted to a test board.

29 Claims, 6 Drawing Sheets

U.S. PATENT DOCUMENTS

| | | |
|---|---|---|
| 5,917,329 | 6/1999 | Cadwallader et al. . |
| 5,926,029 | 7/1999 | Ference et al. . |
| 5,929,647 | 7/1999 | Akram et al. . |
| 5,949,242 | 9/1999 | Wood et al. . |
| 5,962,921 | 10/1999 | Farnworth et al. . |
| 6,018,249 | 1/2000 | Akram et al. . |
| 6,040,702 | 3/2000 | Hembree et al. . |
| 6,064,218 | 5/2000 | Godfrey et al. . |
| 6,072,326 | 6/2000 | Adram et al. . |
| 6,091,251 | 7/2000 | Wood et al. . |
| 6,091,252 | 7/2000 | Akram et al. . |
| 6,094,058 | 7/2000 | Hembree et al. . |
| 6,181,144 | 1/2001 | Hembree et al. . |
| 6,208,156 | 3/2001 | Hembree . |
| 6,218,848 | 4/2001 | Hembree et al. . |

\* cited by examiner

INTERCONNECT AND CARRIER WITH RESISTIVITY MEASURING CONTACTS FOR TESTING SEMICONDUCTOR COMPONENTS

FIELD OF THE INVENTION

This invention relates generally to semiconductor testing, and specifically to a test interconnect, a test method, a test carrier and a test system for testing semiconductor components, such as bare dice and packages.

BACKGROUND OF THE INVENTION

Different types of semiconductor components are tested following the fabrication process. Test systems have been developed for applying test signals to the integrated circuits contained on the components. For example, discrete semiconductor components, such as bare dice and chip scale packages, are tested using carriers designed to temporarily package one or more components. These components include terminal contacts which provide electrical connection points for applying the test signals. For example, bare dice can include terminal contacts, such as planar or bumped bond pads. Chip scale packages can include terminal contacts such as solder balls in a dense grid array.

The test systems include an interconnect that makes the temporary electrical connections with the terminal contacts on the components. This type of interconnect includes contacts that physically and electrically engage the terminal contacts on the component. For example, U.S. Pat. No. 5,686,317 entitled "METHOD FOR FORMING AN INTERCONNECT HAVING A PENETRATION LIMITED CONTACT STRUCTURE FOR ESTABLISHING A TEMPORARY ELECTRICAL CONNECTION WITH A SEMICONDUCTOR DIE", describes an interconnect configured for testing bare dice having planar contacts. U.S. Pat. No. 5,592,736 entitled "FABRICATING AN INTERCONNECT FOR TESTING UNPACKAGED SEMICONDUCTOR DICE HAVING RAISED BOND PADS" describes an interconnect for testing bare dice having bumped contacts.

One problem with the electrical connections between the terminal contacts on the component, and the mating contacts on the interconnect, occurs when oxide layers, or other contaminants, are present on the mating surfaces. For example, aluminum oxide layers can develop on planar aluminum bond pads, and solder oxide layers can develop on exposed surfaces of solder balls. Particulate contaminants such as dust, and other particles, can also be present on the component contacts. These native oxide layers and contaminants can adversely affect the test results, by increasing the resistivity of the temporary electrical connections.

Similarly, the contacts on the interconnect can develop native oxide layers. For this reason the interconnect contacts are sometimes formed of a non-oxidizing material, such as Ti, Pt, Au or $TiS_2$. However, the interconnects are reusable, and the interconnect contacts can be used to test thousands of components over a period of months. Accordingly, contaminants can adhere to the interconnect contacts, increasing the resistivity of the temporary electrical connections with the component contacts. Also, the resistivity, as well as other electrical characteristics of the interconnect contacts, can change with continued use due to deformation of the contacts.

It would be advantageous for an interconnect to have the capability to measure the resistivity of the temporary electrical connections with the terminal contacts on the components. This would permit the test signals to be adjusted in accordance with the measured resistivity. The present invention is directed to an interconnect, test carrier and test system configured to measure the resistivity of the temporary electrical connections between the interconnect and component.

SUMMARY OF THE INVENTION

In accordance with the present invention, a test interconnect, a test method, a test carrier, and a test system for testing semiconductor components, are provided.

The interconnect includes a substrate, and a plurality of interconnect contacts on the substrate for electrically engaging terminal contacts on the components. The interconnect contacts can be configured to electrically engage either planar component contacts (e.g., bond pads, test pads, land pads), or bumped component contacts (e.g., solder balls, metal bumps, conductive polymer bumps). For engaging planar contacts, the interconnect contacts can comprise etched members with projections for penetrating the planar contacts to a limited penetration depth. For engaging bumped contacts, the interconnect contacts can comprise recesses sized and shaped to retain the bumped contacts, or alternately projections configured to penetrate the bumped contacts.

At least one pair of the interconnect contacts comprise resistivity contacts. The resistivity contacts are in electrical communication with test pads configured as a four terminal Kelvin structure. The resistivity contacts and test pads can be used with a resistivity measuring circuit, to determine a contact resistance between the resistivity contacts and interconnected terminal contacts on a component under test. In an illustrative embodiment, the resistivity contacts electrically engage interconnected pairs of power (Vcc), or ground (Vss) terminal contacts on the component, such that an electrical path between the resistivity contacts is provided through the component.

The resistivity measuring circuit evaluates a total resistance Rx of the electrical path between the resistivity contacts. A contact resistance Rc between the resistivity contacts on the interconnect, and the interconnected terminal contacts on the component, forms a portion of the total resistance Rx. The total resistance Rx can be bench marked by testing the interconnect prior to use, or immediately following a cleaning. Using this bench mark, the contact resistance Rc can be quantified using resistivity measurements performed during testing. A high value for the contact resistance Rc can indicate the presence of thick metal oxides or contaminants on the contacts, or can indicate misaligned or damaged contacts.

The resistivity measuring circuit includes two impedance sense terminals, and two impedance source terminals which can be placed in electrical communication with the four terminal Kelvin structure on the interconnect. With this arrangement, test currents can be applied through known resistances RL to the resistivity contacts. In addition, sense currents can be applied through known resistances RL to the resistivity contacts. The sense currents are very low (e.g., pico-amps) such that the I-R drops are low, and the voltage seen by sense terminals is the same as the voltage developed across the resistivity contacts. This enables a total resistance Rx of the electrical path between the resistivity contacts to be measured.

During a test method performed in accordance with the invention, the resistivity measurements can be used to provide feed back for adjusting test signal voltages and currents. The test method includes the steps of analyzing the resistivity measurements, and then controlling test signals as a function of the resistivity measurements. The resistivity measurements can also be used to indicate that the interconnect or the component requires cleaning. In this case the test method can include the step of notifying an operator, or automated tester of the test system, of high values for the resistivity measurements.

The test carrier includes the interconnect, and is configured to retain a component under test. The test carrier also includes a base wherein the interconnect is mounted, and a force applying mechanism for biasing the component against the interconnect. The test system includes multiple interconnects, and force applying mechanisms, mounted to a test board.

DETAILED DESCRIPTION OF THE PREFERRED EMBODIMENTS

Figure 1A:
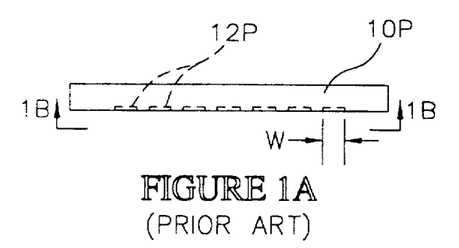
FIG. 1A is an enlarged side elevation view of a prior art semiconductor component having planar terminal contacts.
Figure 1B:
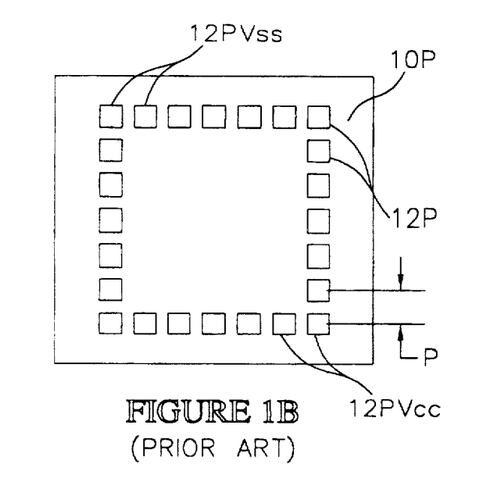
FIG. 1B is an enlarged bottom view of the component taken along section line 1B—1B of FIG. 1A.

Referring to FIGS. 1A and 1B, a prior art semiconductor component 10P having planar terminal contacts 12P is illustrated. As used herein, the term "semiconductor component" refers to an electronic component that includes a semiconductor die. Exemplary semiconductor components include bare semiconductor dice, chip scale packages, ceramic semiconductor packages, and plastic semiconductor packages.

The planar terminal contacts 12P are in electrical communication with integrated circuits contained on the semiconductor component 10P. The planar terminal contacts 12P allow electrical access from the outside to the integrated circuits on the component 10P. The planar terminal contacts 12P can comprise thin film bond pads or test pads, thin or thick film land pads, or other planar elements formed on a surface of the component 10P. The planar terminal contacts 12P have a width W (FIG. 1A) and a pitch P (FIG. 1B). In addition, the planar terminal contacts 12P are formed in a spaced array along the peripheral edges of the component 10P. Alternately, other patterns can be provided for the planar terminal contacts 12P, such as along a center line of the component 10P, or along opposite edges of the component 10P. As another example, the planar terminal contacts 12P can be formed in a dense grid pattern of columns and rows.

Each of the planar terminal contacts 12P provides a different electrical path to the integrated circuits contained on the component 10P. For example, some of the planar terminal contacts 12P provide electrical paths for applying input signals and control signals to the integrated circuits. Other planar terminal contacts 12P provide electrical paths for receiving output signals from the integrated circuits. As shown in FIG. 1B, the component 10P includes a pair of ground contacts 12PVss that provide electrical paths to ground for the integrated circuits on the component 10P. Typically, the ground contacts 12PVss are in electrical communication with one another, through internal electrical paths within the component 10P. In addition, a pair of the power contacts 12PVcc provide electrical paths to a power source for the integrated circuits on the component 10P. The power contacts 12PVcc are also in electrical communication with one another, through internal electrical paths within the component 10P.

Figure 1C:
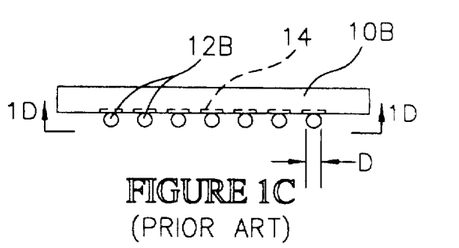
FIG. 1C is an enlarged side elevation view of a prior art bumped semiconductor component having bumped terminal contacts.
Figure 1D:
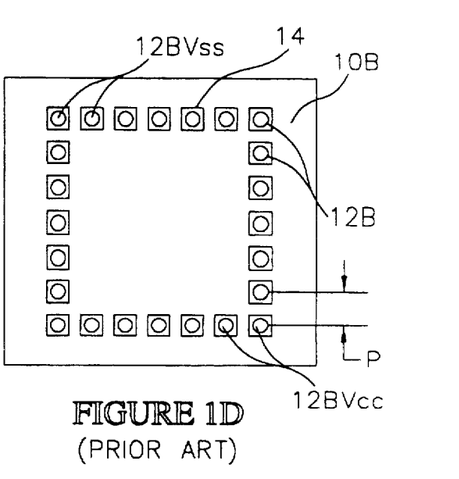
FIG. 1D is an enlarged bottom view of the bumped component taken along section line 1D—1D of FIG. 1C.

FIGS. 1C and 1D illustrate a prior art component 10B that includes bumped terminal contacts 12B. As with the planar terminal contacts 12P (FIG. 1B), the bumped terminal contacts 12B are in electrical communication with the integrated circuits contained on the component 10B. In addition, the bumped terminal contacts 12B are arranged in a similar spaced array along a periphery of the component 10B. Alternately, the bumped terminal contacts 12B can be arranged in other patterns such as a dense grid array (e.g., ball grid array).

As shown in FIG. 1C, the bumped terminal contacts 12B can comprise metal balls, such as solder balls, attached to pads 14 on the component 10. Alternately, the bumped terminal contacts 12B can have any conventional shape that provides a raised contact surface. By way of example, representative shapes include truncated spherical, hemispherical, dome, bump and conical. In addition, the bumped terminal contacts 12B have a diameter D and a pitch "P". A representative range for the diameter D (and for the width W of planar terminal contacts 12P-FIG. 1B) can be from about 0.127 mm (0.005 inch) to 0.762 mm (0.030 inch). A representative range for the pitch P can be from about 0.228 mm (0.008 inch) to 2.0 mm (0.078 inch).

As shown in FIG. 1D, the component 10B includes a pair of ground contacts 12BVss that provide electrical paths to ground for the integrated circuits on the component 10B. As with the ground contacts 12PVss (FIG. 1B), the ground contacts 12BVss are in electrical communication with one another, through internal electrical paths within the component 10B. Similarly, a pair of the power contacts 12BVcc provide electrical paths to a power source for the integrated circuits on the component 10B. The power contacts 12BVcc are also in electrical communication with one another, through internal electrical paths within the component 10B.

Referring to FIGS. 2–5, an interconnect 16, and a test carrier 18 constructed in accordance with the invention are illustrated. The test carrier 18 is adapted to temporarily package the semiconductor component 10B with bumped terminal contacts 12B for testing and burn-in. Alternately, the test carrier 18 can be constructed to test the semiconductor component 10P (FIG. 1A) with planar terminal contacts 12P (FIG. 1A). The interconnect 16 mounts to the carrier 18 and includes interconnect contacts 34 (FIG. 4) for making temporary electrical connections with the bumped terminal contacts 12B on the component 10B. Further details of the interconnect contacts 34 will be hereinafter described.

Figure 2:
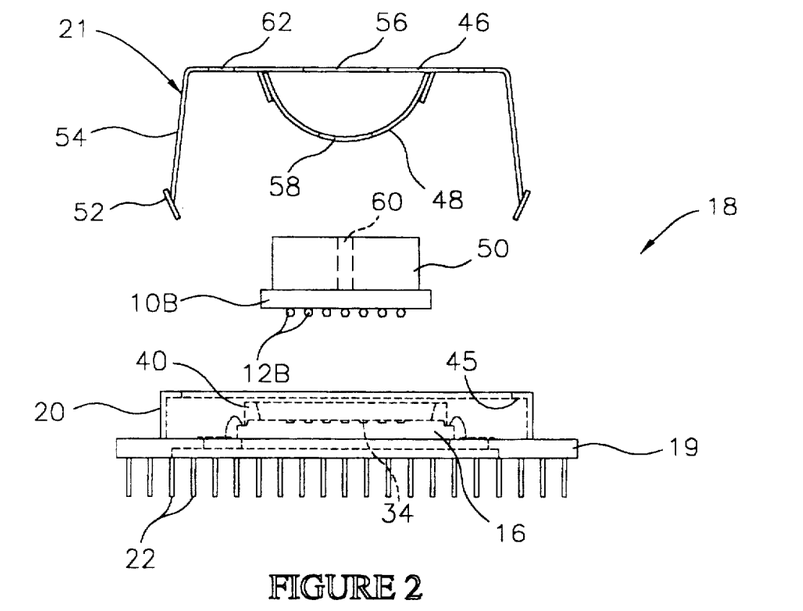
FIG. 2 is an exploded side elevation view of a test carrier constructed in accordance with the invention.
Figure 3:
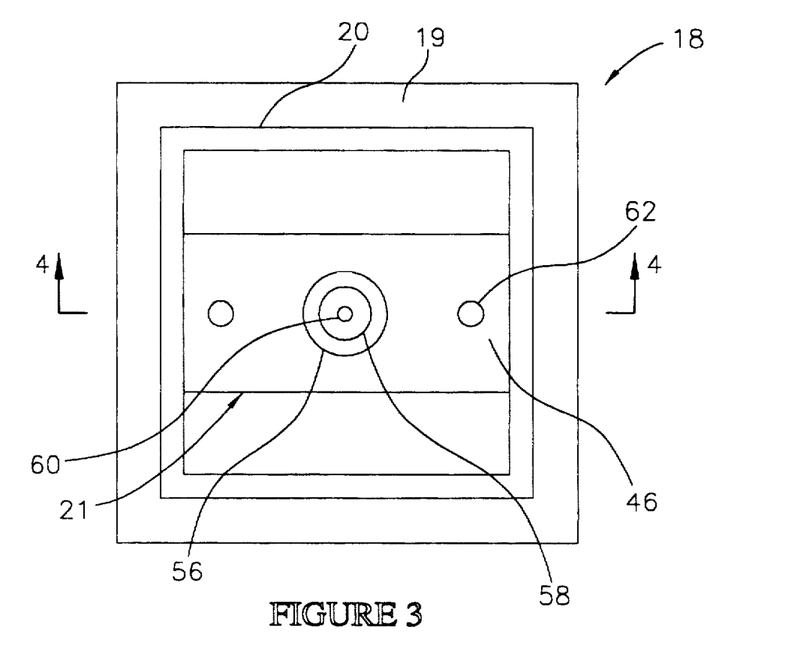
FIG. 3 is a plan view of the assembled test carrier of FIG. 1.
Figure 4:
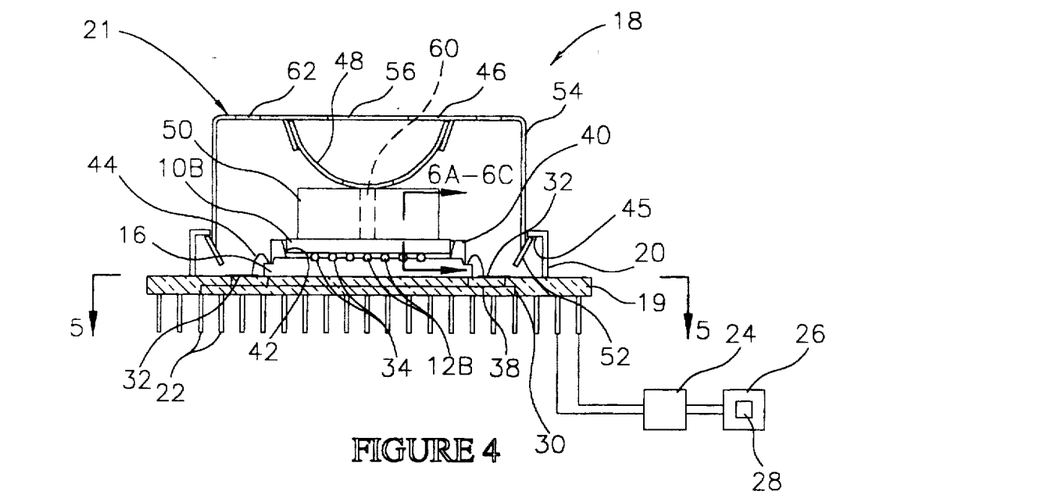
FIG. 4 is a cross sectional view of the test carrier taken along line 4—4 of FIG. 3.

The test carrier 18, broadly stated, comprises: a base 19 wherein the interconnect 16 is mounted; a force applying mechanism 21 for biasing the component 10B against the interconnect 16; and a clamp ring 20 on the base 19 for attaching the force applying mechanism 21 to the base 19. The structure and function of these elements will become more apparent as the description proceeds.

The base 19 provides a support structure for the other elements of the carrier 18, such as the interconnect 16 and the force applying mechanism 21. The interconnect 16 can be adhesively bonded to the base 19 or merely placed thereon. The force applying mechanism 21 can be removably attached to the base 19 in a manner to be hereinafter explained. In addition to providing a support function, the base 19 in cooperation with the force applying mechanism 21, houses and retains the component 10B.

The base 19 can comprise a rigid, electrically-insulating material, such as ceramic, plastic or a glass filled resin. For example, a ceramic lamination process can be used to fabricate the base 19 with a desired geometry, and with metal features, such as internal conductors and external pads. U.S. Pat. No. 5,519,332 entitled "CARRIER FOR TESTING AN UNPACKAGED SEMICONDUCTOR DIE", and U.S. Pat. No. 5,878,485 entitled "METHOD FOR FABRICATING A CARRIER FOR TESTING UNPACKAGED SEMICONDUCTOR DICE", which are incorporated herein by reference, describe a ceramic lamination process for fabricating the base 19.

Alternately, rather than ceramic, the base 19 can comprise molded plastic formed using a 3-D molding process. The above incorporated U.S. Pat. Nos. 5,519,332 and 5,878,485 describe a 3-D molding process for fabricating the base 19. Rather than ceramic or molded plastic, the base 19 can comprise a glass reinforced plastic (e.g., FR-4) similar to materials used for printed circuit boards. In this case, conventional plastic substrate fabrication processes, as described in *Ball Grid Array Technology*, by John H. Lau, McGraw-Hill, Inc., 1995, can be used for fabricating the base 19.

As shown in FIG. 4, the terminal contacts 22 on the base 19 are adapted for electrical communication with a test apparatus 24 and test circuitry 26. The test apparatus 24 can comprise a test board, such as a burn-in board, having one or more sockets for electrically engaging the terminal contacts 22 on the base 19. The test circuitry 26 generates test signals, and transmits the test signals through the test apparatus 24 to the terminal contacts 22, then through the contacts 34 on interconnect 16 to the component 10B. The test circuitry 26 also analyzes test signals transmitted from the component 10B to the test circuitry 26. This permits various electrical characteristics of the component 10B to be evaluated. For some applications, the test circuitry 26 can be included in a tester specifically designed for testing semiconductor components. Suitable testers are commercially available from Teradyne of Boston, Mass., as well as other manufacturers.

The test circuitry 26 also includes a resistivity measuring circuit 28. The resistivity measuring circuit 28 allows a contact resistance between selected interconnect contacts 34 and selected bumped terminal contacts 12B on the component 10B to be evaluated. The operation of the resistivity measuring circuitry 28 will be more fully explained as the description proceeds.

As shown in FIG. 4, the terminal contacts 22 on the base 19 comprise pins formed in a pin grid array (PGA) on a bottom surface of the base 19. Alternately, other configurations for the terminal contacts 22 can be provided. For example, the carrier base 19 can include ball contacts in a ball grid array (BGA), or fine ball grid array (FBGA). Alternately the carrier base 19 can include pins in other shapes such a j-bend or butt joint.

As also shown in FIG. 4, the base 19 also includes terminal conductors 30 in electrical communication with selected terminal contacts 22 and with bond pads 32 on the base 19. The terminal conductors 30 can include internal portions formed within the structure of the base 19, and also external portions formed on exposed surfaces of the base 19. The internal portions of the terminal conductors 30 can be formed using processes such as via filling, lamination and molding. The external portions of the terminal conductors 30 can be formed using a metallization process, such as deposition, photopatterning and etching.

As also shown in FIG. 4, the interconnect 16 includes an alignment member 40 for aligning the component 10B to the interconnect 16, such that the bumped terminal contacts 12B on the component 10B electrically engage the interconnect contacts 34. The alignment member 40 can comprise silicon, ceramic, plastic, FR-4, or a deposited and cured polymer, such as a thick film resist. The alignment member 40 includes an alignment opening 42 having a peripheral outline that is slightly larger than a peripheral outline of the component 10B. The alignment opening 42 includes sloped sidewalls (or alternately straight sidewalls), adapted to contact the outside edges of the component 10B, to guide the component 10B onto the interconnect 16.

In FIG. 4, the alignment member 40 is illustrated as being attached to the interconnect 16. However, the alignment member 40 can also be attached to the base 19, or formed integrally therewith. A suitable method for fabricating a silicon alignment member is described in U.S. Pat. No. 5,559,444, entitled "METHOD AND APPARATUS FOR TESTING UNPACKAGED SEMICONDUCTOR DICE", incorporated herein by reference. As will be further explained, the alignment member 40 can also be eliminated and alignment performed using optical alignment techniques. A suitable method for fabricating a polymer alignment member is described in U.S. patent application Ser. No. 08/988,433 filed Dec. 11, 1997, now U.S. Pat. No. 6,018,249, entitled "TEST SYSTEM WITH MECHANICAL ALIGNMENT FOR SEMICONDUCTOR CHIP SCALE PACKAGES AND DICE".

Figure 5:
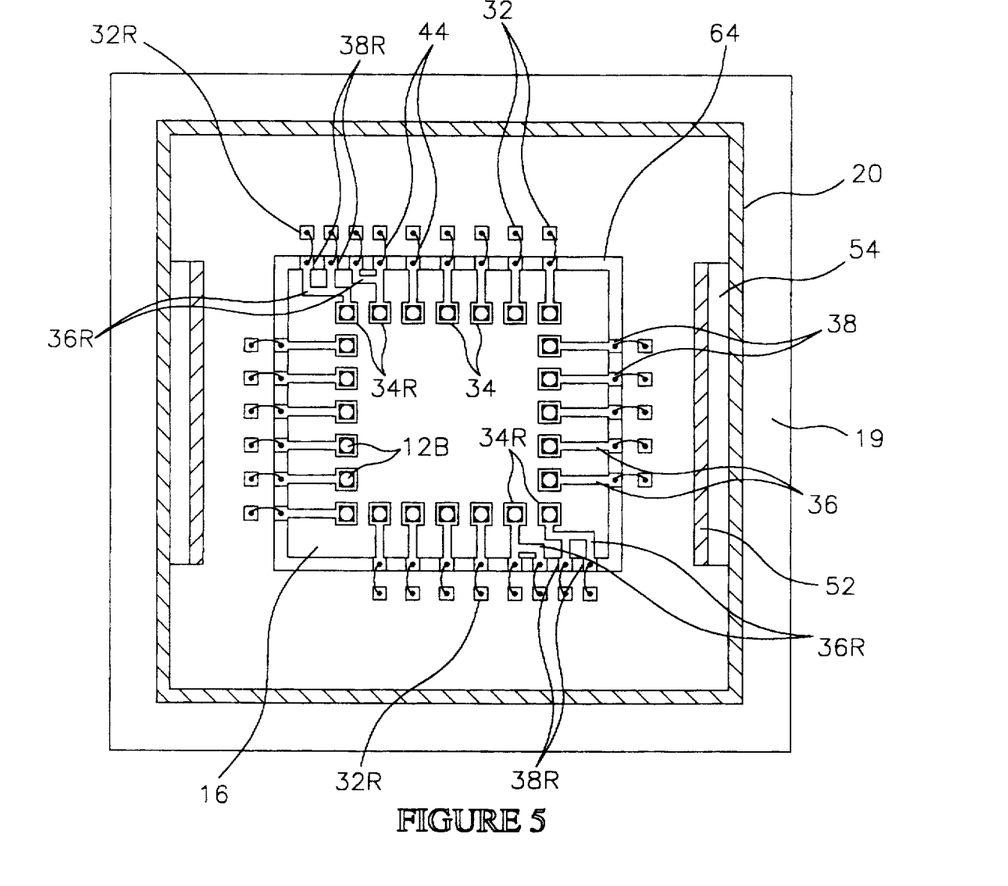
FIG. 5 is an enlarged plan view of the interconnect and a base of the carrier taken along section line 5—5 of FIG. 4.

As shown in FIG. 5, the interconnect 16 also includes conductors 36 in electrical communication with the interconnect contacts 34. In addition, the interconnect 16 includes bond pads 38 in electrical communication with the conductors 36. Bond wires 44 are wire bonded to the bond pads 32 on the base 19, and to the bond pads 38 on the interconnect 16. The bond wires 44 complete the electrical paths between the interconnect contacts 34 and the terminal contacts 22 on the base 19.

Referring again to FIG. 4, the force applying mechanism 21 can be removably attached to the clamp ring 20 during assembly of the carrier 18. The clamp ring 20 has a generally frame like configuration and includes grooves 45 wherein the force applying mechanism 21 is attached. In the illustrative embodiment, the clamp ring 20 comprises metal, and is attached to the base 19 using a brazing process. One suitable metal for the clamp ring 20 comprises "KOVAR" coated with gold. The base 19 can include bonding features, such as metal pads for attaching the clamp ring 20.

The force applying mechanism 21 comprises a clamp 46, a biasing member 48, and a pressure plate 50. The clamp 46 comprises a flexible bridge-like structure formed of a resilient material such as steel. The clamp 46 includes opposed sides 54 movable towards one another. The clamp 46 also includes tabs 52 that physically engage the grooves 45 of the clamp ring 20. Additionally, the clamp 46 includes an opening 56 which provides access to the component 10B for a vacuum assembly tool during assembly of the test carrier 18. The biasing member 48 also includes an opening 58, and the pressure plate 50 includes an opening 60 for the vacuum assembly tool. A pair of openings 62 can also be provided on the clamp 46 for manipulation of the clamp 46 by a vacuum assembly tool during assembly of the carrier.

In the illustrative embodiment, the biasing member 48 is made of a resilient spring material such as steel, and as shown in FIG. 4, has a generally bow or leaf spring shape. The biasing member 48 can also comprise an elastomeric block. U.S. patent application Ser. No. 08/988,433 filed Dec. 11, 1997, now U.S. Pat. No. 6,018,249, entitled "TEST SYSTEM WITH MECHANICAL ALIGNMENT FOR SEMICONDUCTOR CHIP SCALE PACKAGES AND DICE", which is incorporated herein by reference, describes an exemplary example of an elastomeric block biasing member. Also for some applications, the pressure plate 50 can be eliminated particularly if the force applying mechanism 21 includes an elastomeric block biasing member.

Figure 6A:
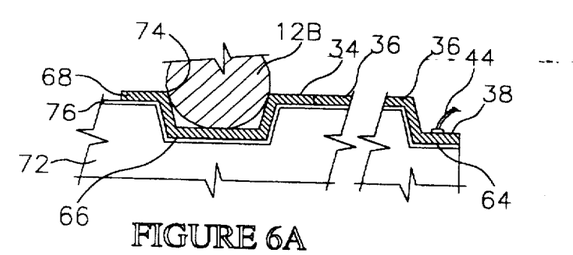
FIG. 6A is an enlarged schematic cross sectional view, taken along 6A—6A of FIG. 4, illustrating a contact on the interconnect engaging a bumped terminal contact on the component of FIG. 1C.

Referring to FIG. 6A, an interconnect contact 34 is shown electrically engaging a bumped terminal contact 12B on the component 10B. The interconnect contact 34 can be formed integrally with a substrate 72 of the interconnect 16. Preferably, the substrate 72 comprises silicon, such that a coefficient of thermal expansion (CTE) of the interconnect 16 matches that of the semiconductor component 10B, which typically also comprises silicon. Alternately, germanium, a reinforced glass resin material, or a ceramic material, can be used as the substrate material.

The interconnect contact 34, broadly stated, comprises: a recess 66 in the interconnect substrate 72; a conductive layer 68 on the recess 66; and an insulating layer 76 between the substrate 72 and the conductive layer 68. One method for forming the recess 66 is by forming a mask (not shown) on the interconnect substrate 72, such as a photopatterned resist mask, and then etching the interconnect substrate 72 through openings in the mask, using an etchant. With the interconnect substrate 72 comprising silicon, a suitable etchant for performing the etch process comprises a solution of KOH.

The recess 66 is sized and shaped to retain and electrically engage the bumped terminal contact 12B. A representative diameter, or width, of the recess 66 can be from 2 mils to 50 mils or more. This diameter can be less than a diameter of the bumped terminal contact 12B so that only portions thereof will be contacted. A depth of the recess 66 can be equal to or less than the diameter of the recess 66. A pitch or spacing of the recess 66 relative to adjacent recesses 66 will exactly match a pitch P (FIG. 1D) of the bumped terminal contact 12B.

The conductive layer 68 can comprise a layer of a highly conductive metal such as aluminum, titanium, nickel, iridium, copper, gold, tungsten, silver, platinum, palladium, tantalum, molybdenum or alloys of these metals. The conductive layer 68 can be formed on the insulating layer 76 to a desired thickness using a suitable metallization process (e.g., CVD, photopatterning, etching). Peripheral edges 74 of the conductive layer 68 are adapted to penetrate native oxide layers on the bumped terminal contact 12B to contact the underlying metal.

As also shown in FIG. 6A, the conductive layer 68 is in electrical communication with the conductor 36 and the bond pad 38 on the interconnect substrate 72. The bond wire 44 electrically connects the bond pad 38 to the corresponding bond pad 32 (FIG. 5) on the base 19. In addition, the substrate 72 can include a stepped surface 64 wherein the bond pad 38 is located, to provide a recessed area for attaching the bond wire 44.

The conductive layers 68 and conductors 36 can be formed using a same metallization process, or using different metallization processes. In addition, the conductive layers 68 and conductors 36 can be formed as multi-layered stacks of metals (e.g., bonding layer/barrier layer). Still further, the conductors 36 can be electrically insulated with an outer insulating layer (not shown).

Further details of the interconnect contact 34 are described in U.S. patent application Ser. No. 08/829,193, filed Mar. 31, 1997, now U.S. Pat. No. 5,962,921, entitled "INTERCONNECT HAVING RECESSED CONTACT MEMBERS WITH PENETRATING BLADES FOR TESTING SEMICONDUCTOR DICE AND PACKAGES WITH CONTACT BUMPS", which is incorporated herein by reference.

Figure 6B:
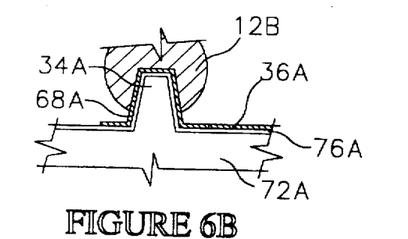
FIG. 6B is an enlarged schematic cross sectional view, equivalent to FIG. 6A, of an alternate embodiment interconnect contact electrically engaging the bumped terminal contact.

Referring to FIG. 6B, a second embodiment interconnect contact 34A comprises a projection formed integrally with a substrate 72A, which preferably comprises silicon or other etchable material. One method for forming the interconnect contact 34A is by etching the substrate 72A as described in U.S. Pat. No. 5,483,741, entitled "METHOD FOR FABRICATING A SELF LIMITING SILICON BASED INTERCONNECT FOR TESTING BARE SEMICONDUCTOR DICE", which is incorporated herein by reference. The interconnect contact 34A includes a conductive layer 68A formed using a metallization process as previously described. The conductive layer 68A is in electrical communication with a conductor 36A on the substrate 72A. In addition, an insulating layer 76A can be formed on the substrate 72A to electrically insulate the conductive layer 68A.

The interconnect contact 34A is adapted to penetrate into the bumped terminal contact 12B to form an electrical connection therewith. In FIG. 6B, the interconnect contact 34A is shown as penetrating a center of the bumped terminal contact 12E, forming a void therein. However, penetration can be along the peripheral edges of the bumped terminal contact 12B in which case a groove would be formed.

Figure 6C:
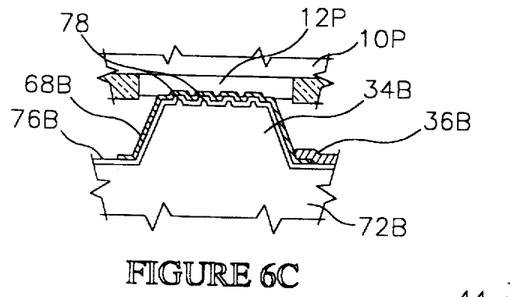
FIG. 6C is an enlarged schematic cross sectional view equivalent to FIG. 6A of another alternate embodiment interconnect contact electrically engaging a planar terminal contact on the component of FIG. 1A.

Referring to FIG. 6C, a third embodiment interconnect contact 34B is adapted to electrically engage the planar terminal contact 12P on the component 10P. The interconnect contact 34B comprises a projection formed integrally with a substrate 72B. The interconnect contact 34B also includes penetrating projections 78 configured to penetrate the planar terminal contact 12P to a limited penetration depth. In addition, the interconnect contact 34B includes a conductive layer 68B in electrical communication with a conductor 36B on the substrate 72B, and an insulating layer 76B for electrically insulating the conductive layer 68B. Further details of the interconnect contact 34B are described in U.S. Pat. No. 5,686,317, entitled "METHOD FOR FORMING AN INTERCONNECT HAVING A PENETRATION LIMITED CONTACT STRUCTURE FOR ESTABLISHING TEMPORARY ELECTRICAL COMMUNICATION WITH A SEMICONDUCTOR DIE", which is incorporated herein by reference.

In each of the above embodiments the bumped terminal contact 12B (or planar terminal contact 12P) can be aligned with the interconnect contacts 34 (or 34A or 34B) using the alignment member 40 (FIG. 4). Alternately, an optical alignment technique as described in U.S. Pat. No. 5,796,264, entitled "METHOD AND APPARATUS FOR MANUFACTURING KNOWN GOOD SEMICONDUCTOR DIE", which is incorporated herein by reference, can be used.

Figure 7:
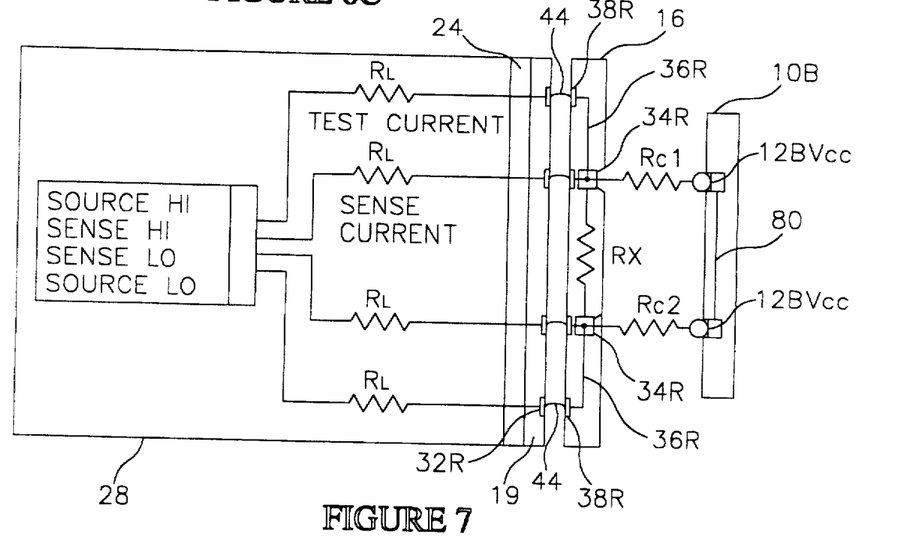
FIG. 7 is an electrical schematic of a resistivity measuring circuit and associated electrical paths to the interconnect and component.

Referring to FIG. 7, an electrical schematic of the electrical paths between the resistivity measuring circuit 28 and the component 10B are illustrated. As previously explained, the component 10B includes a pair of interconnected power contacts 12BVcc for supplying power to the integrated circuits contained on the component 10B. The power contacts 12BVcc are in electrical communication with one another via an internal electrical path 80 within the component 10B.

The interconnect 16 includes resistivity contacts 34R configured for mating electrical engagement with the power contacts 12BVcc. During a test procedure the power contacts 12BVcc on the component 10B are placed in electrical engagement with the resistivity contacts 34R on the interconnect 16. The contact resistances Rc1 and Rc2 between the power contacts 12BVcc and the resistivity contacts 34R are unknown resistances. The resistivity measuring circuit 28 is configured to measure total resistance Rx. The total resistance Rx can then be used along with a previous calibration procedure, to quantify the contact resistances Rc1 and Rc2.

The resistivity contacts 34R on the interconnect 16 are in electrical communication with conductors 36R and test pads 38R on the interconnect 16. As shown in FIG. 5, the test pads 38R are configured as a four terminal Kelvin structure. In addition, bond wires 44 electrically connect the test pads 38R to corresponding bond pads 32R on the base 19 of the test carrier 18. The bond pads 32R are in electrical communication with corresponding terminal contacts 22 (FIG. 4) which electrically engage mating contacts (not shown) on the test apparatus 24. The test apparatus 24, for example, can comprise a burn-in board having electrical sockets (not shown) adapted for mating electrical engagement with the terminal contacts 22 on the base 19 of the test carrier 18.

The resistivity measuring circuit 28 is in electrical communication with the test apparatus 24. The resistivity measuring circuit 28 can comprise a conventional high impedance voltmeter, or a digital multimeter. Suitable multimeters are commercially available from Keithley Instruments, Cleveland, Ohio, and other instrument manufacturers. Alternately the resistivity measuring circuit 28 can be built into the test circuitry 26 (FIG. 4).

The resistivity measuring circuit 28 has four separate electrical terminals including a "SOURCE HI", a "SENSE HI", a "SENSE LOW", and a "SOURCE LOW". A "TEST CURRENT" from the resistivity measuring circuit 28 is routed from the source terminals through one of the test pads 38R for each of the resistivity contacts 34R on the interconnect 16. Similarly, a "SENSE CURRENT" is routed from the sense terminals through one of the test pads 38R for each of the resistivity contacts 34R on the interconnect 16.

With this arrangement, an unknown resistance Rx between the resistivity contacts 34R can be measured by applying the test current from source terminals (SOURCE HI, SOURCE LO) through a known resistance RL to the resistivity contacts 34R on the interconnect 16. In addition, a sense current can be applied from sense terminals (SENSE HI, SENSE LO) through known resistances to the resistivity contacts 34R on the interconnect 16. The SENSE CURRENT is very low (e.g., pico-amps) such that the I-R drop is low and the voltage seen by the sense terminals (SENSE HI, SENSE LO) is the same as the voltage developed across Rx. This enables Rx to be measured and then evaluated for quantifying the contact resistances (Rc1 and Rc2).

One method for evaluating the resistance Rx is by making resistivity measurements when the interconnect 16 is new, or immediately following cleaning. These initial values for Rx provide a bench mark, which can be compared to measured values for Rx during test procedures using the interconnect. The contact resistances (Rc1 and Rc2) between the resistivity contacts 34R on the interconnect 16 and the power contacts 12BVcc on the component 10B comprises a variable portion of the resistance Rx. Accordingly, the difference between the initially measured value of Rx and the value measured during testing quantifies the contact resistances (Rc1 and Rc2).

A high value for Rx may indicate that the electrical connections between the resistivity contacts 34R on the interconnect 16 and the power contacts 12BVcc on the component 10B are substandard. This may be due to misalignment of the interconnect 16 and component 10B, or due to contaminants on the mating surfaces thereof. The resistivity of the resistivity contacts 34R on the interconnect 16 and the power contacts 12BVcc are also components of the resistance Rx. Accordingly, a high value for Rx may indicate contaminated or dirty resistivity contacts 34R or power contacts 12BVcc.

Figure 8:
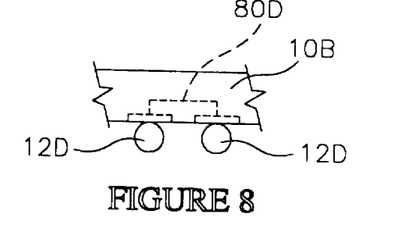
FIG. 8 is a schematic cross sectional view of dummy terminal contacts on the component configured to provide resistivity measurements.

The same resistivity measuring procedure can be performed by placing the resistivity measuring circuit 28 in electrical communication with the ground contacts 12BVss on the component 10B. In general the resistivity measuring procedure can be performed on any pair of contacts on the component 10B that are electrically connected to one another. For example, as shown in FIG. 8, dummy contacts 12D interconnected by electrical path 80D can be constructed on the component 10B for the purpose of providing resistivity measurements.

Figure 9:
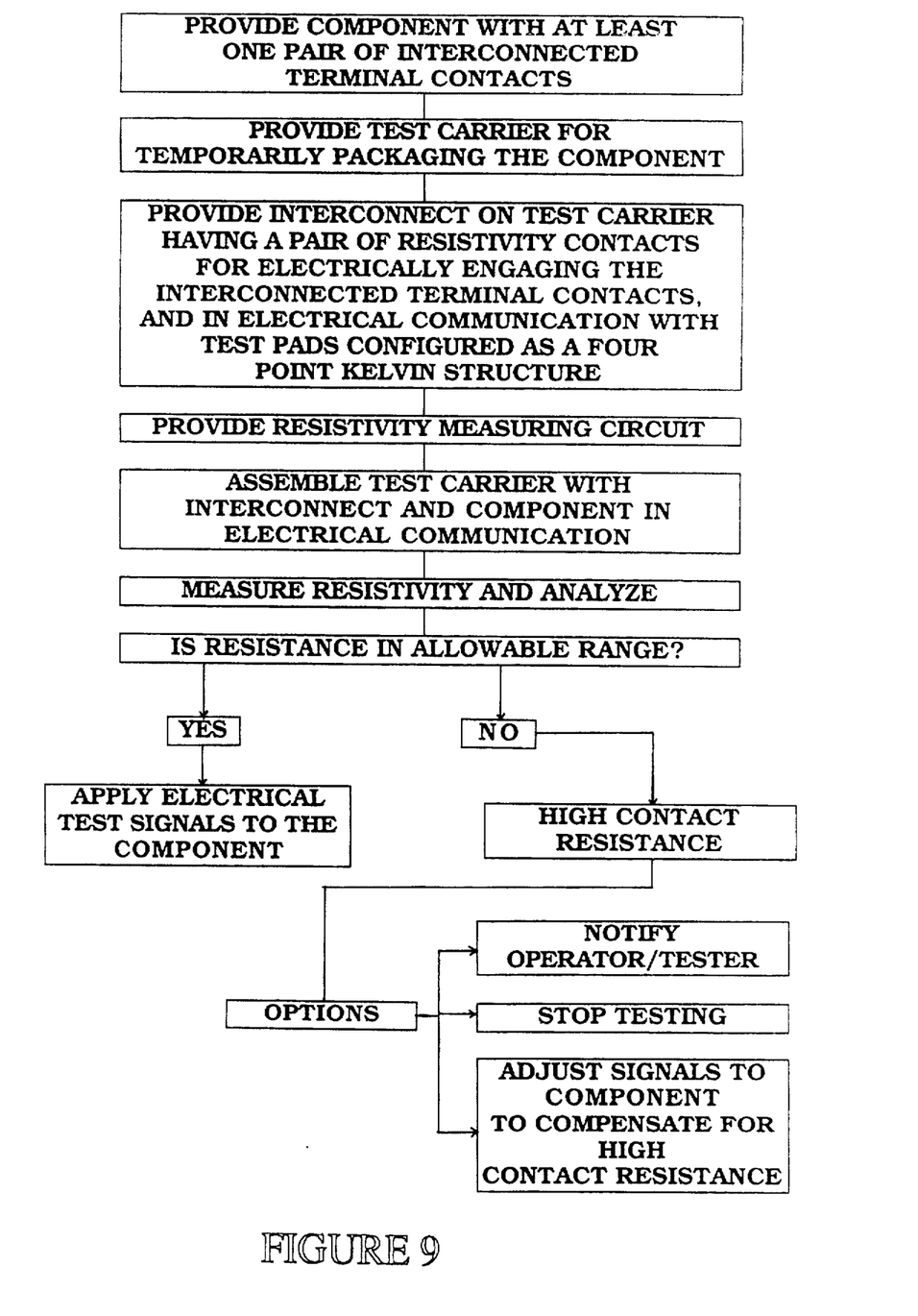
FIG. 9 is a flow diagram of steps in a test method testing performed in accordance with the invention.

Referring to FIG. 9, steps in a test method performed in accordance with the invention are illustrated. Initially, the component 10B (or 10P) is provided with at least one pair of interconnected contacts. The interconnected contacts can comprise power 12BVcc (or 12PVcc) or ground 12BVss (or 12PVss) contacts on the component 10B (or 10P). Alternately, the component 10B (or 10P) can be configured with dummy contacts 12D (FIG. 8) for measuring electrical resistivity.

In addition to providing the component 10B (or 10P), the test carrier 18 and the interconnect 16 are provided. The interconnect 16 includes paired resistivity contacts 34R in electrical communication with test pads 38R configured as a four terminal Kelvin structure substantially as previously described.

A resistivity measuring circuit 28 is also provided. The resistivity measuring circuit can be contained in a portable instrument such as a multimeter, or alternately built into test circuitry 26 for testing the component.

Next, the carrier 18 is assembled with the interconnect 16 and the component 10B (or 10P) in electrical communication. Assembly of the carrier 18 can be accomplished as disclosed in previously incorporated U.S. Pat. No. 5,796,264.

Next, the resistance between the interconnected contacts 12BVcc (or 12BVss) on the component 10B and the resistivity contacts 34R on the interconnect 16 is measured using the resistivity measuring circuit 28. In addition, the resistivity measurements are analyzed using a suitable apparatus such as a computer. The resistivity measurements are then used to control test signals to the component 10B. For example, if the resistance measurements are in an allowable range, test signals can be applied to the component 10B. If the resistance measurements are high, this is indicative of a high contact resistance between the interconnect contacts 34 and the component contacts 12B.

When a high contact resistance is detected several options are available, including: notifying the test operator or tester, stopping the test procedure, or adjusting the test signals to compensate for the high contact resistance.

Figures 10A, 10B:
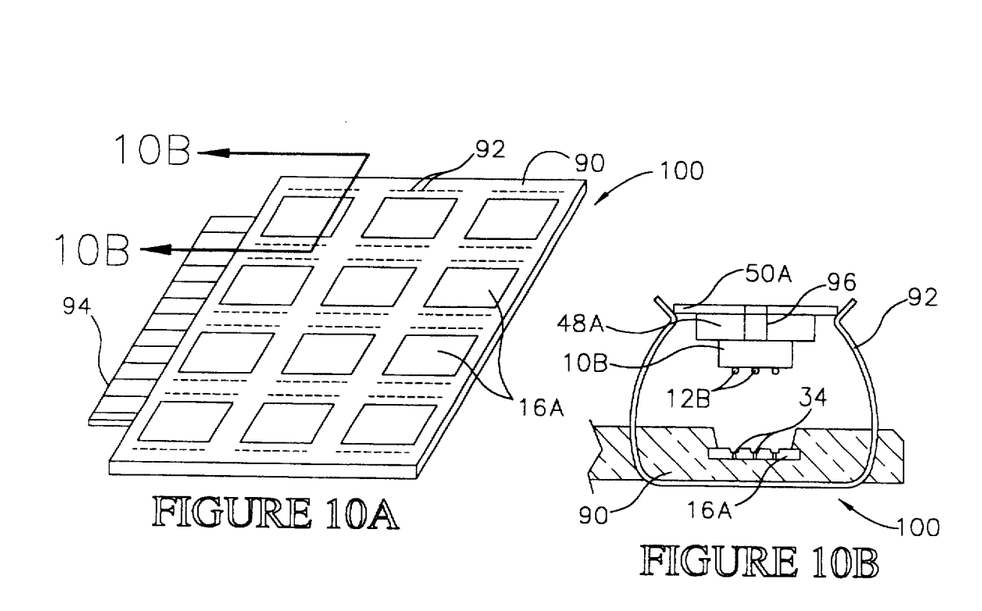
FIG. 10A is a schematic perspective view of test system constructed in accordance with the invention.
FIG. 10B is a cross sectional view taken along section line 10B—10B of FIG. 10A.

Referring to FIGS. 10A and 10B, a test system 100 constructed in accordance with the invention is illustrated. The test system comprises a board 90 containing a plurality of interconnects 16A. The interconnects 16A are substantially equivalent to the interconnect 16 previously described. The interconnects 16A can be molded, laminated, or simply attached to the board 90. Each interconnect 16A includes a pattern of interconnect contacts 34 formed as previously described. At least one pair of the interconnect contacts 34 are configured as resistivity contacts, substantially as previously described for resistivity contacts 34R (FIG. 5).

The interconnect contacts 34 are in electrical communication with an electrical connector 94 on the board 90, such as an edge connector containing multiple contacts. Surface conductors (not shown) on the board 90, or internal conductors (not shown) within the board 90, electrically connect the interconnect contacts 34 to the electrical connector 94 on the board 90. At least four of the contacts on the electrical connector 94 can be configured as a four terminal Kelvin structure in electrical communication with the resistivity contacts substantially as previously described.

In the illustrative embodiment, the board 90 comprises a glass filled resin such as an epoxy glass (FR-4), a polyimide glass or a cyanate-glass material. In addition to being electrically insulating and structurally rigid, these materials can be laminated, cured, and then metallized using deposition and photolithography processes. Also, required features can be punched or machined using processes employed in the fabrication of printed circuit boards (PCB), and other electronic devices.

Alternately, rather than the above materials, the board 90 can comprise an electronics grade plastic, such as polyetherimide (PES), polyethersulfone (PES), polyether-ether ketone (PEEK), polyphenylene sulfide (PPS), or a liquid crystal polymer (LCP). With these plastics the board 90 can be shaped and metallized using a molding process such as 3-D injection molding.

Alternately, the board 90 can comprise ceramic. With ceramic, a ceramic lamination and metallization process can be used to construct the board 90. As another alternative, the board 90 can comprise silicon, or other semiconducting material. With silicon, etching, micro machining, and metallization processes used for semiconductor circuit fabrication can be used to construct the board 90.

As shown in FIG. 10B, a pressure plate 50A and an elastomeric biasing member 48A, are associated with each interconnect 16A. In addition, a vacuum passage 96 can be formed through the pressure plate 50A and the biasing member 48A, for retaining a component 10B for assembly on the board 90.

As shown in FIG. 10B, the board 90 also includes a plurality of clip members 92 associated with each interconnect 16A. The clip members 92 comprise resilient metal or plastic members that can either be molded integrally with the board, or attached with suitable fasteners. With the component 10B placed on the interconnect 16A, the clip members 92 hold the component 10B in place for testing.

The component 10B can be assembled to the biasing member 48A and pressure plate 50A, and aligned with the interconnect 16A using optical alignment techniques. U.S. Pat. No. 5,634,267, entitled "Method And Apparatus For Manufacturing Known Good Semiconductor Die", which is incorporated herein by reference, describes a method of optical alignment.

Thus the invention provides an improved interconnect, test carrier, test method and test system for testing semiconductor components. Although the invention has been described with reference to certain preferred embodiments, as will be apparent to those skilled in the art, certain changes and modifications can be made without departing from the scope of the invention, as defined by the following claims.

I claim:

1. A method for testing a semiconductor component having a plurality of component contacts including a first component contact electrically connected to a second component contact, the method comprising:

providing a carrier for packaging the component comprising a base having plurality of terminal contacts including a first terminal contact and a second terminal contact;

providing an interconnect on the base comprising a plurality of interconnect contacts in electrical communication with the terminal contacts including a first resistivity contact in electrical communication with the first terminal contact configured to electrically engage the first component contact, a second resistivity contact in electrical communication with the second terminal contact configured to electrically engage the second terminal contact, and a four terminal Kelvin structure in electrical communication with the first resistivity contact and the second resistivity contact;

assembling the carrier with the first resistivity contact electrically engaging the first component contact and the second resistivity contact electrically engaging the second component contact;

measuring a resistance of an electrical path between the first terminal contact and the second terminal contact using the Kelvin structure;

applying test signals through the terminal contacts and the interconnect contacts to the component contacts; and controlling the test signals based on the resistance.

2. The method of claim 1 wherein the controlling step comprises adjusting the test signals, stopping the test signals, or notifying an operator if the resistance is outside an allowable range.

3. The method of claim 1 wherein the measuring step comprises comparing the resistance to a previously measured resistance for the interconnect.

4. The method of claim 1 wherein the component contacts comprise bumps and the interconnect contacts comprise recesses configured to retain the bumps or projections configured to penetrate the bumps.

5. A method for testing a semiconductor component having a plurality of component contacts including a first component contact electrically connected to a second component contact, the method comprising:

providing a board comprising an electrical connector and a biasing mechanism for retaining the component on the board;
  providing an interconnect on the board comprising a plurality of interconnect contacts in electrical communication with the electrical connector including a first resistivity contact configured to electrically engage the first component contact, a second resistivity contact configured to electrically engage the second terminal contact, and a four terminal Kelvin structure in electrical communication with the first resistivity contact and the second resistivity contact;
  retaining the component on the board with the first resistivity contact electrically engaging the first component contact and the second resistivity contact electrically engaging the second component contact;
  measuring a resistance of an electrical path between the first resistivity contact and the second resistivity contact using the Kelvin structure;
  applying test signals through the electrical connector and the interconnect contacts to the component contacts; and
  adjusting the test signals based on the resistance.

6. The method of claim 5 wherein the biasing mechanism comprises a spring and a clip.

7. The method of claim 5 wherein the controlling step comprises adjusting the test signals, stopping the test signals or notifying an operator if the resistance is outside an allowable range.

8. The method of claim 5 wherein the measuring step comprises comparing the resistance to a previously measured resistance for the interconnect.

9. The method of claim 5 wherein the component contacts comprise bumps and the interconnect contacts comprise recesses configured to retain the bumps or projections configured to penetrate the bumps.

10. The method of claim 5 wherein the component contacts comprise planar pads and the interconnect contacts comprise projections configured to penetrate the pads.

11. A method for testing semiconductor components comprising:

providing a component comprising a first component contact electrically connected to a second component contact;
  providing a carrier configured to retain the component comprising a base and a plurality of terminal contacts on the base including a first terminal contact and a second terminal contact;
  providing an interconnect on the base comprising a plurality of interconnect contacts in electrical communication with the terminal contacts including a first resistivity contact in electrical communication with the first terminal contact, a second resistivity contact in electrical communication with the second terminal contact and a four terminal Kelvin structure in electrical communication with the first resistivity contact and the second resistivity contact;
  assembling the component in the carrier with the first component contact in electrical communication with the first resistivity contact, and the second component contact in electrical communication with the second resistivity contact;
  applying a test current and a sense current through the Kelvin structure to the first resistivity contact and to the second resistivity contact, to measure a total resistance of an electrical path between the first resistivity contact and the second resistivity contact;
  evaluating the total resistance;
  applying test signal through the terminal contacts and the interconnect contacts to the component contacts; and
  controlling the test signals based on the evaluating step.

12. The method of claim 11 wherein the first component contact and the second component contact comprise power or ground contacts.

13. The method of claim 11 wherein the component contacts comprise bumps and the interconnect contacts comprise recesses configured to retain the bumps or projections configured to penetrate the bumps.

14. The method of claim 11 wherein the controlling step comprises stopping the test signals, adjusting the test signals or notifying an operator if the resistance is outside an allowable range.

15. A method for testing a semiconductor component having a plurality of component contacts including a pair of interconnected contacts, the method comprising:

providing a test carrier configured to retain the component, the test carrier comprising a base having a plurality of terminal contacts and a force applying mechanism attachable to the base for applying a biasing force to the component;
  providing an interconnect on the base comprising a plurality of interconnect contacts including a pair of resistivity contacts configured to electrically engage the interconnected contacts on the component and a four terminal Kelvin structure in electrical communication with the resistivity contacts and with selected terminal contacts on the base;
  assembling the test carrier with the resistivity contacts in electrical communication with the interconnected component contacts and with the force applying mechanism biasing the component and the interconnect together;
  providing a resistivity measuring circuit in electrical communication with the selected terminal contacts on the base;
  measuring a resistance of an electrical path between the resistivity contacts using the resistivity measuring circuit and the Kelvin structure; and
  applying test signals through the terminal contacts and the interconnect contacts to the component contacts provided the resistance is within a selected range.

16. The method of claim 15 further comprising determining the selected range by testing the interconnect prior to the assembling step.

17. The method of claim 15 wherein the component contacts comprise planar pads and the interconnect contacts comprise projections configured to penetrate the pads.

18. The method of claim 15 wherein the resistivity measuring circuit is contained on test circuitry configured to generate and analyze the test signals.

19. The method of claim 15 wherein the measuring the resistance step comprises applying a test current and a sense current through the selected terminal contacts on the base to the four terminal Kelvin structure.

20. The method of claim 16 wherein the component comprises an element selected from the group consisting of dice and packages.

21. A carrier for testing a semiconductor component having a plurality of component contacts including a pair of interconnected component contacts comprising:

a base comprising a plurality of terminal contacts configured for electrical communication with test circuitry;

an interconnect on the base comprising a plurality of interconnect contacts in electrical communication with the terminal contacts configured to establish temporary electrical connections with the component contacts;

the interconnect comprising a pair of resistivity contacts configured to electrically engage the interconnected component contacts, and a four terminal Kelvin structure in electrical communication with the pair of resistivity contacts and with selected terminal contacts on the base;

the pair of resistivity contacts configured to evaluate a resistance of an electrical path therebetween upon application of a sense current and a test current to the selected terminal contacts.

22. The carrier of claim 21 further comprising a force applying mechanism attachable to the base configured to bias the component and the interconnect together.

23. The carrier of claim 21 wherein the four terminal Kelvin structure comprises four bond pads wire bonded to four corresponding bond pads on the base in electrical communication with the selected terminal contacts.

24. A carrier for testing a semiconductor component having a plurality of component contacts including a pair of interconnected component contacts, the carrier comprising:

a base comprising a plurality of terminal contacts configured for electrical communication with test circuitry;

an interconnect on the base comprising a plurality of interconnect contacts configured to electrically engage the component contacts;

the interconnect contacts including a pair of resistivity contacts configured to electrically engage the interconnected component contacts;

a four terminal structure on the interconnect in electrical communication with the resistivity contacts and with four terminal contacts on the base;

the resistivity contacts, the four terminal structure and the four terminal contacts configured to measure a total resistance of an electrical path between the resistivity contacts during electrical engagement of the interconnected component contacts, the total resistance comprising a contact resistance between the resistivity contacts and the interconnected component contacts.

25. The carrier of claim 24 further comprising a force applying mechanism on the base configured to bias the component and the interconnect together.

26. The carrier of claim 24 wherein the component comprises an element selected from the group consisting of dice and packages.

27. The carrier of claim 24 wherein the component contacts comprise bumps and the interconnect contacts comprise recesses configured to retain the bumps or projections configured to penetrate the bumps.

28. A test system for testing semiconductor components comprising:

a board comprising an electrical connector configured for electrical communication with test circuitry;

a plurality of interconnects on the board in electrical communication with the electrical connector and configured to establish temporary electrical connections with a plurality of component contacts on the components;

each interconnect comprising a first resistivity contact configured to electrically engage a first component contact on a component, a second resistivity contact configured to electrically engage a second component contact on the component in electrical communication with the first component contact, and a four terminal Kelvin structure including two terminals in electrical communication with the first resistivity contact and the electrical connector, and two terminals in electrical communication with the second resistivity contact and the electrical connector; and a plurality of force applying mechanisms attached to the board configured to bias the components against the interconnects.

29. The system of claim 28 wherein the component contacts comprise bumps and the interconnect contacts comprise recesses configured to retain the bumps or projections configured to penetrate the bumps.

* * * * *